(12) United States Patent
Shibata et al.

(10) Patent No.: US 6,809,609 B1
(45) Date of Patent: Oct. 26, 2004

(54) DEVICE FOR PREVENTING MIXING OF EXTRINSIC NOISE AND PROTECTOR

(75) Inventors: Junichi Shibata, Nisshin (JP); Akira Hayakawa, Nisshin (JP); Masatoshi Sugita, Nisshin (JP)

(73) Assignee: Maspro Denkoh Co., LTD, Aichi-ken (JP)

( * ) Notice: Subject to any disclaimer, the term of this patent is extended or adjusted under 35 U.S.C. 154(b) by 608 days.

(21) Appl. No.: 09/621,641

(22) Filed: Jul. 21, 2000

(30) Foreign Application Priority Data

Jul. 27, 1999 (JP) .............................. 11-211854
Apr. 28, 2000 (JP) ........................... 2000-130864

(51) Int. Cl.⁷ .............................. H04B 3/28; H03H 7/00; H03H 7/38
(52) U.S. Cl. ................. 333/12; 333/24 R; 333/177; 333/181; 333/32; 348/21; 348/607
(58) Field of Search ................. 333/12, 32, 24 R, 333/177, 181; 348/21, 607

(56) References Cited

U.S. PATENT DOCUMENTS

| | | | | |
|---|---|---|---|---|
| 4,240,052 A | * | 12/1980 | Hallford et al. | ............ 333/202 |
| 4,326,179 A | * | 4/1982 | Lasar | ........................ 333/177 |
| 5,091,707 A | * | 2/1992 | Wollmerschauser et al. | .. 333/12 |
| 5,132,647 A | * | 7/1992 | Lopez et al. | ................ 333/175 |
| 6,404,179 B1 | * | 6/2002 | Sugiura et al. | ............ 323/355 |

FOREIGN PATENT DOCUMENTS

JP 61-53845 * 3/1986

* cited by examiner

*Primary Examiner*—Barbara Summons
(74) *Attorney, Agent, or Firm*—Pearson & Pearson, LLP

(57) ABSTRACT

A two-staged coupling transformer comprised of an up-stream coupling transformer and a down-stream coupling transformer are successively provided between an input terminal and an output terminal, wherein respective primary windings are connected to the input side while secondary windings are connected to the output side. The up-stream coupling transformer and the down-stream coupling transformer are set to be of identical turns ratios and are connected by respectively converting each other.

11 Claims, 6 Drawing Sheets

(a)

(b)

DEVICE FOR PREVENTING MIXING OF EXTRINSIC NOISE AND PROTECTOR

BACKGROUND OF THE INVENTION

1. Technical Field of the Invention

The present invention relates to a device for preventing mixing of extrinsic noise provided in a signal transmission path for bi-directionally transmitting high-frequency signals as performed in a bi-directional CATV system with the aim of eliminating extrinsic noise flowing into up-stream signals, and the present invention further relates to a protector provided between such a signal transmission path and a signal input unit of a receiver apparatus such as a television receiver for protecting such connected apparatuses as the receiver by preventing breaking in of abnormal voltage.

2. Description of the Prior Art

One example of a circuitry view of a conventional protector is illustrated in FIG. 8. In FIG. 8, 1 denotes an input terminal to which a coaxial cable is connected, 2 an output terminal, wherein central electric conductors of both terminals are connected through a coupling capacitor 15 with an arrestor 5 and a choke coil 6 being provided on the input side so as to be formed between the conductor and respective grounds. An external electric conductor of the input terminal 1 is grounded while an external electric conductor of the output terminal 2 is grounded through a feed through capacitor 16. Noise-mixing ratio characteristics, which represent ratios of noise caught by the external electric conductor of a coaxial cable on an output side of this circuit being mixed in a transmission system on an input side, of this circuit will be characterized as illustrated in FIG. 10, wherein the noise-mixing ratio exceeds −40 dB at 10 MHz to 40 MHz.

It has been suggested for arrangements in which a coupling transformer is provided in a protector such as techniques as disclosed in Japanese Patent Examined Publication No. 5-54234 (1993) or Japanese Patent Examined Publication No. 5-50210 (1993). Of these two, the former Japanese Patent Examined Publication No. 5-54234 is arranged in that one ferrite element (coupling transformer) is obtained by winding two insulated wires between input and output terminals of a protector, wherein a primary side is connected to the input terminal side and a secondary side to the output terminal side. In the latter Japanese Patent Examined Publication No. 5-50210, an additional ferrite element that is obtained by winding two insulated wires is provided between input and output terminals wherein windings on primary sides are connected to core wire portions for input and output while winding on secondary sides are connected to external electric conductors for input and output.

In a bi-directional CATV system, it is generally the case that frequencies of not less than 70 MHz are used as down-stream frequency bands that are send out from central stations while frequencies of 10 MHz to 55 MHz are used as up-stream frequency bands for sending signals from respective homes of users in directions of the central stations. In the years, it has been aimed for achieving wide-band frequencies such that frequencies of up to 770 MHz, which are ground wave bands, are being transmitted, and it is further planned to transmit BS-IF bands exceeding such values. It is thus being demanded that apparatuses, which are interposed at some midpoints of signal transmission paths, exhibit favorable characteristics over an even broader range.

In view of this point, the protector of FIG. 8 exhibits poor noise-mixing ratio characteristics in such frequency bands and is not favorable since its effect for decreasing streamed noises is insufficient.

The above protector with the primary side of the ferrite element being connected to the input terminal side while the secondary side is connected to the output terminal side exhibits favorable signal passing characteristics in a range of 50 MHz to 300 MHz as represented by the signal passing characteristics and return loss characteristics in FIG. 9. However, when transmission is performed at frequencies of up to 770 MHz or in a range of 1035 to 1335 MHz that correspond to the BS-IF band, the protector cannot be used owing to the fact that traps are included in proximities of 1000 to 1200 MHz, and in case noise shall be caught by the external electric conductor on the output side, this noise will appear at the core wire on the input terminal side to cause generation of large streamed noises.

Also in case the primary side windings of ferrite elements are connected to input and output core wire portions and secondary windings to input and output external electric conductors, noise caught in the external electric conductors on the output side will not be completely eliminated such that it will appear on the core wire side on the input side.

The present invention has been made in view of the above problems, and it is a subject of the present invention to provide a device for preventing mixing of extrinsic noise and a protector that exhibit favorable signal passing characteristics for high-frequencies exceeding 770 MHz and in which noise caught on output sides are hardly transmitted to core wire units on input sides.

SUMMARY OF THE INVENTION

For solving the above subject, the device for preventing mixing of extrinsic noise according to the invention of claim 1 is a device for preventing mixing of extrinsic noise comprising an input terminal and an output terminal to which coaxial cables are connectable, with high-frequency signals being passed between the input terminal and the output terminal while direct current is prevented from passing on both, a core wire side and a ground side, wherein a pair of coupling transformers with primary windings and second windings is provided between the input terminal and the output terminal through cascade connection with one end of a primary winding on an up-stream side of the pair of coupling transformers being connected to a core wire of the input terminal while the other end thereof is connected to a ground on the input side, and wherein one end of a secondary winding on a down-stream side is connected to a core wire of the output terminal while the other end thereof is connected from the ground on the input side to a ground on the output side of which direct current is prevented from passing.

The invention of Claim 2 is characterized to be the device for preventing mixing of extrinsic noise as claimed in Claim 1, wherein the one end connected to the core wire of the input terminal of the up-stream coupling transformer and the one end connected to the core wire of the output terminal of the down-stream coupling transformer are connected through a choke coil.

The invention of Claim 3 is characterized to be the device for preventing mixing of extrinsic noise as claimed in Claim 1, wherein the pair of coupling transformers are connected such that turns ratios of the primary windings and the second windings are opposite to each other.

The invention of Claim 4 is characterized to be the device for preventing mixing of extrinsic noise as claimed in Claim 1, wherein frequency characteristics of the pair of coupling transformers are set such that one is of low-frequency passing type and the other of high-frequency passing type. The protector according to the invention of Claim 5 is a protector comprising the device for preventing mixing of extrinsic noise as claimed in Claim 1, the protector comprising an arrestor and a choke coil for preventing breaking in of abnormal voltage.

DESCRIPTION OF THE PREFERRED EMBODIMENTS

Figure 1:
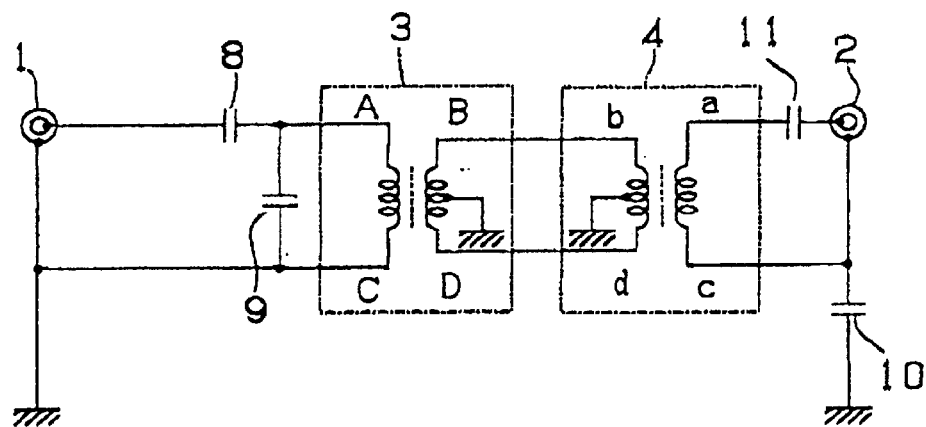
FIG. 1 is a circuitry view showing one example of an embodiment of the device for preventing mixing of extrinsic noise according to the present invention.

One form of embodiment in which the present invention is materialized will now be explained in details with reference to the drawings. FIG. 1 is a circuitry view illustrating one example of the device for preventing mixing of extrinsic noise according to the present invention, wherein central electric conductors of an input terminal 1 and an output terminal 2 are connected through a two-staged coupling transformer comprised of an up-stream coupling transformer 3 and a down-stream coupling transformer 4. A coupling capacitor 8 is provided between the input terminal 1 and the up-stream coupling transformer 3 while a capacitor 9 is provided in a parallel manner to primary windings of the up-stream coupling transformer 3. One end of the down-stream coupling transformer 4 and the output terminal 2 are connected through a coupling capacitor 11 while the other end of the down-stream coupling transformer 4 and an external electric conductor of the output terminal 2 are grounded through a capacitor 10. The capacitor 10 comprises a protection network for preventing high current from flowing into apparatuses connected to the output side in case of thunder-bold or generation of high voltage.

The up-stream coupling transformer 3 and the down-stream coupling transformer 4 are formed by winding primary and secondary windings for, for instance, three times around rings made of ferrite, and are connected at symmetric positions to be converse to each other. A central portion of the secondary winding of the up-stream coupling transformer 3 and a central portion of the primary winding of the down-stream coupling transformer are ground. In this manner, no signals of high-frequency or noise will pass through terminals A–B (between a–b) and terminals C–B (between c–b), and current flowing through terminals A–C (between a–c) may effectively be induced to between terminals B–D (between b–d).

Actions will now be explained based on a case in which noise has broken in from the output terminal 2 of this circuit. When noise has been caught by the external electric conductor of the coaxial cable on the output side, a corresponding noise current will pass through the grounding capacitor 10 to the ground. While this noise current is also applied to one end c of the secondary winding of the down-stream coupling transformer 4, it will not flow through the secondary winding since the other end a will be of higher potential. This noise current will then appear on the one end b or the other end d of the primary winding not through induction but owing to distributed capacity between the windings.

Even though this noise current shall appear on the one end b or the other end d of the primary winding, the provision of the up-stream coupling transformer 3, which is arranged to be a conversed version of the down-stream coupling transformer 4, will cause both of the noise transmitted from the terminal d to the terminal D as well as noise transmitted from the terminal b to terminal B to appear at terminal C owing to reversibility of the up-stream coupling transformer 3 to be eliminated to the ground of still lower potential. With this arrangement, it is possible to achieve favorable noise-mixing ratio characteristics not only in a band of 10 to 40 MHz in which streamed noise will particularly be problematic but also at frequencies exceeding as much as 1000 MHz, and extrinsic noise flowing into up-stream signals can be eliminated by a simple of arrangement in which coupling transformers are connected in conversed manners.

It should be noted that the noise-mixing ratio characteristics are measured by adding signals corresponding to noise to between a ground on the output side and a ground on the input side to see how much of these signals corresponding to noise will be damped and how much will appear between the core wire and the ground of the input terminal 1. Measuring is performed with each of the elements assuming the following values; 1000 pF for the coupling capacitor 8, 1 pF for the capacitor 9, 6000 pF for the grounding capacitor 10, wherein the primary windings of the up-stream coupling transformer 1 are wound to be triple-wound and the primary windings to be triple-wound on the right and left with a neutral point being a center, and the down-stream coupling transformer 4 is arranged to be identical to the up-stream coupling transformer but of a conversed arrangement.

Figure 3:
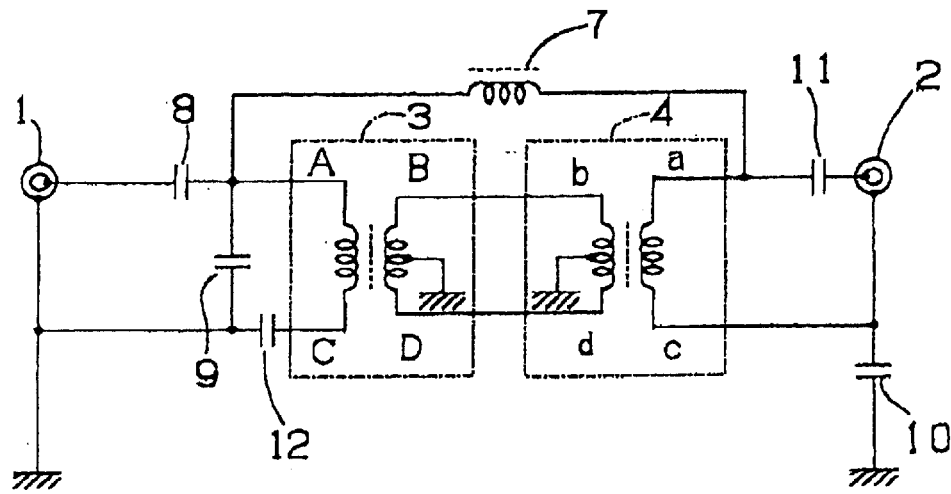
FIG. 3 is a circuitry view showing another example of the device for preventing mixing of extrinsic noise.

FIG. 3 illustrates another embodiment of a device for preventing mixing of extrinsic noise, wherein its basic circuit is identical to that of the above-described first embodiment but differ therefrom in that its input terminal connecting portion of an up-stream coupling transformer and an output terminal connecting portion of a down-stream coupling transformer are connected through a choke coil 7. It should be noted that a capacitor 12 that is interposed to an external electronic conductor on the input terminal 1 side is a coupling capacitor provided for performing interruption/separation of direct current or low-frequency signals between an external electronic conductor of the output terminal 2 and the external electronic conductor of the input terminal 1.

Figure 4:
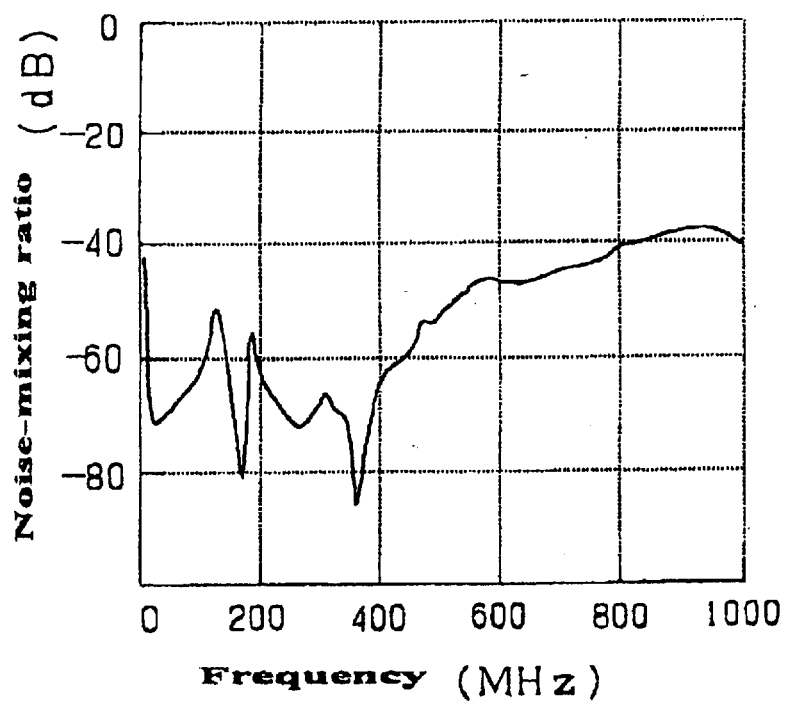
FIG. 4 is a characteristic view of a noise-mixing ratio for the device for preventing mixing of extrinsic noise of FIG. 3.
Figure 5:
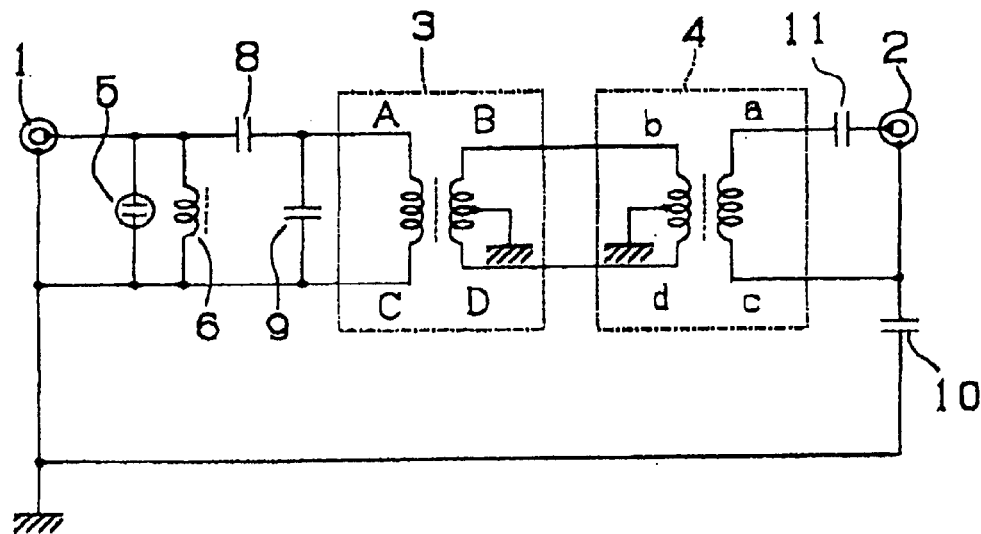
FIG. 5 is a circuitry view showing an example of the protector according to the present invention.

The provision of the choke coil 7 functions to improve dielectric strength, and it is possible to obtain a device for preventing mixing of extrinsic noise which does not perform discharge even at an alternating current of 1000V though conventional ones used to perform discharge at an alternating current of 200V to 300V. Noise-mixing ratio characteristics of such a circuit proves to be a favorable one over a wide band as illustrated in FIG. 4, and even if noise should break in from an external electronic conductor of a coaxial cable that is connected to the output side, it is prevented from entering to a core wire on the input side, and it is possible to decrease streamed noise. It should be noted that values of the respective elements of the measuring circuit are identical to those of the above embodiment, and the choke coil 7 is of 10 μH The protector will now be explained. FIG. 5 is a circuitry view showing one example of the protector according to the present invention, wherein an arrestor 5 and a choke coil 6 are provided between primary windings of an up-stream coupling transformer in addition to the arrangement as illustrated in FIG. 1.

Figure 2:
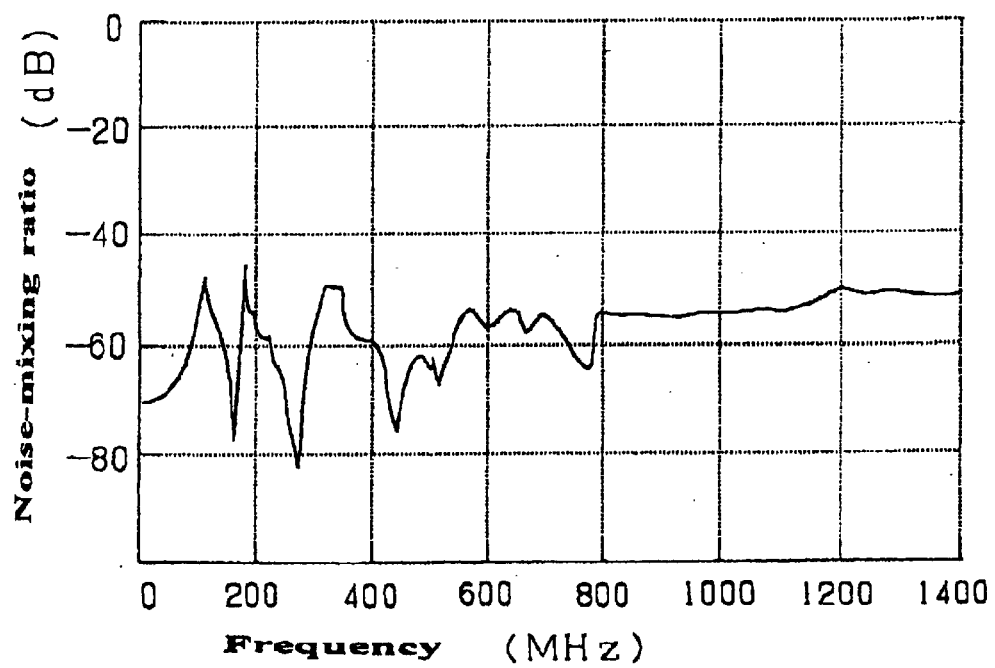
FIG. 2 is a characteristic view of a noise-mixing ratio for the device for preventing mixing of extrinsic noise of FIG. 1.
Figure 6:
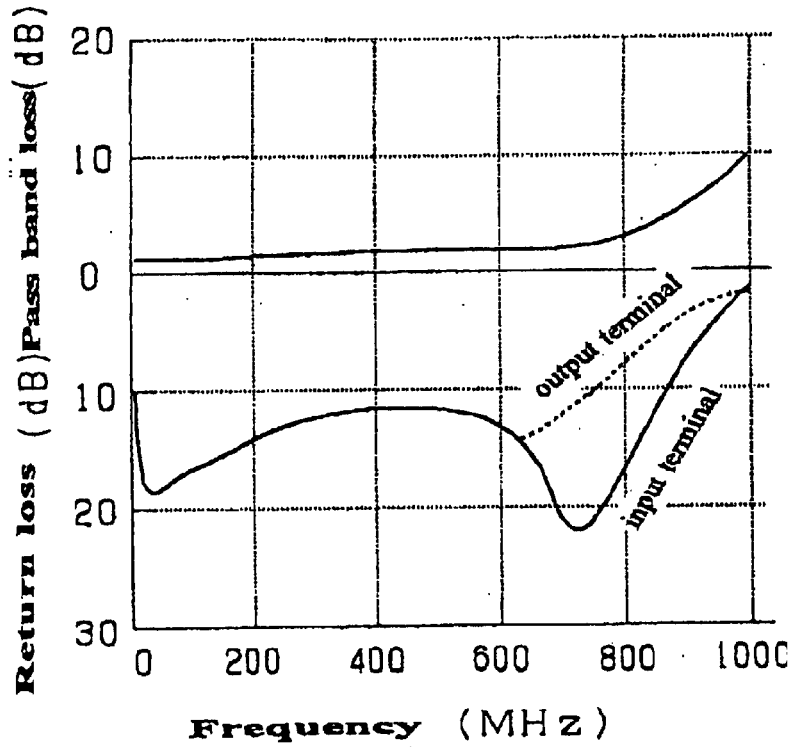
FIG. 6 is a signal passing characteristic view of the protector of FIG. 5.

Signal passing characteristics of the thus arranged protector are illustrated in FIG. 6. As it is obvious from the drawing, flat passing characteristics are exhibited in a range of 10 to 770 MHz, and high-frequency signals entering the input terminal 1 are transmitted to the output terminal 2 with hardly any losses. Noise-mixing ratio characteristics of such a circuit are identical to those of the above FIG. 2, and it is possible to eliminate streamed noise flowing into up-stream signals.

Figure 7:
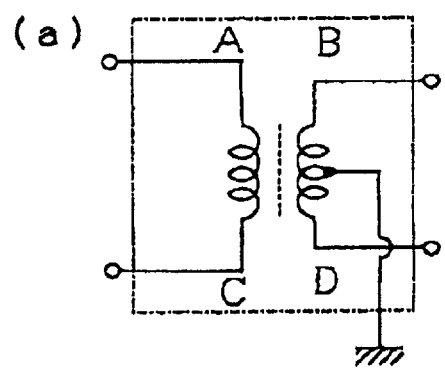
FIG. 7 is a partial circuitry view showing another embodiment of the present invention.
Figure 7:
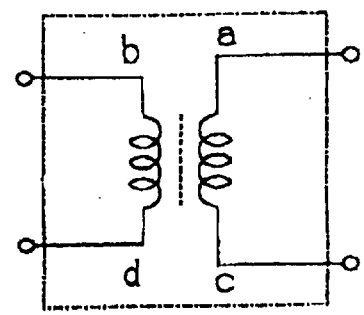
Figure 7:
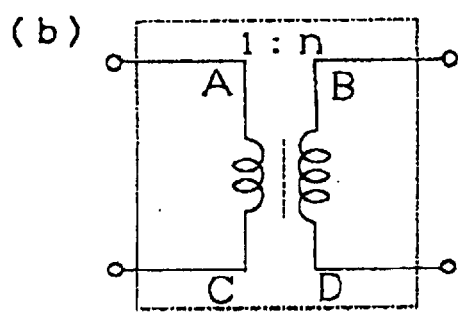
Figure 7:
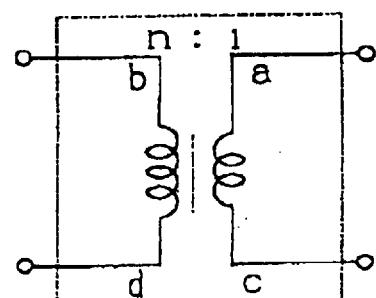
Figure 8:
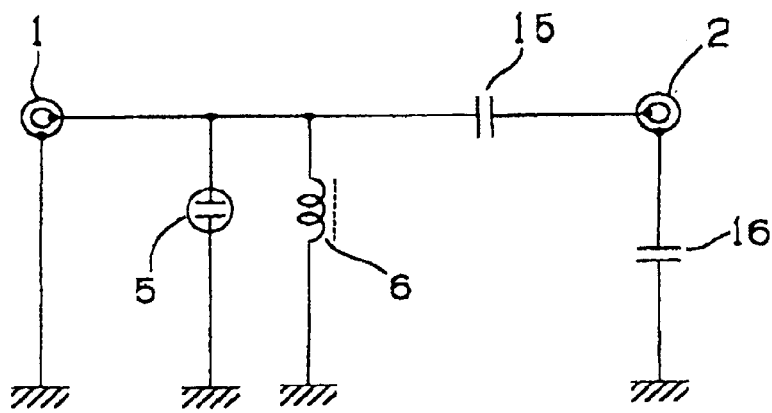
FIG. 8 is a circuitry view of a conventional protector.
Figure 9:
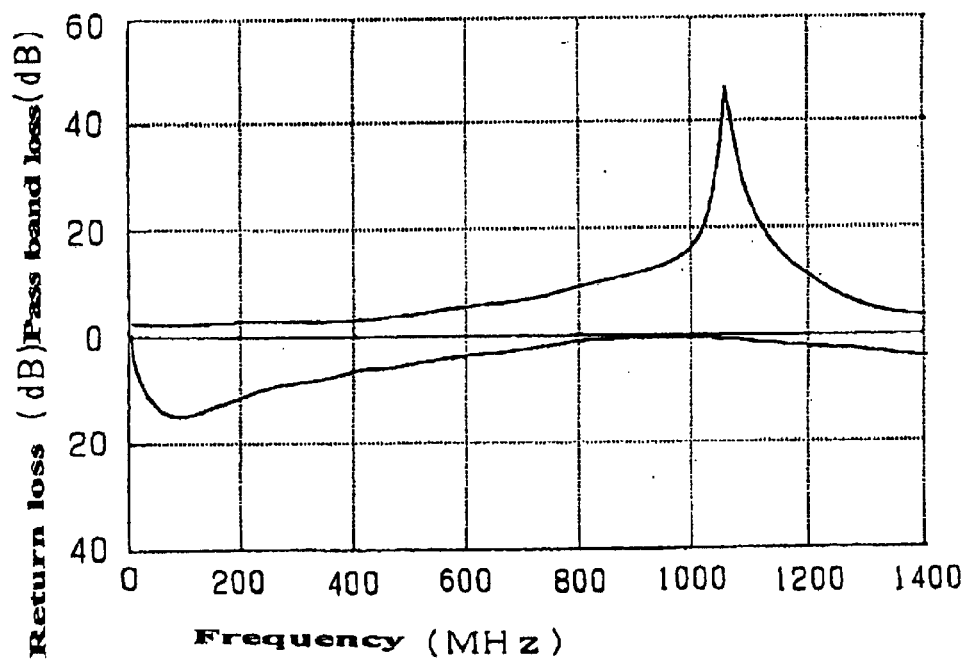
FIG. 9 is a signal passing characteristic view of a protector employing one pair of coupling transformers.
Figure 10:
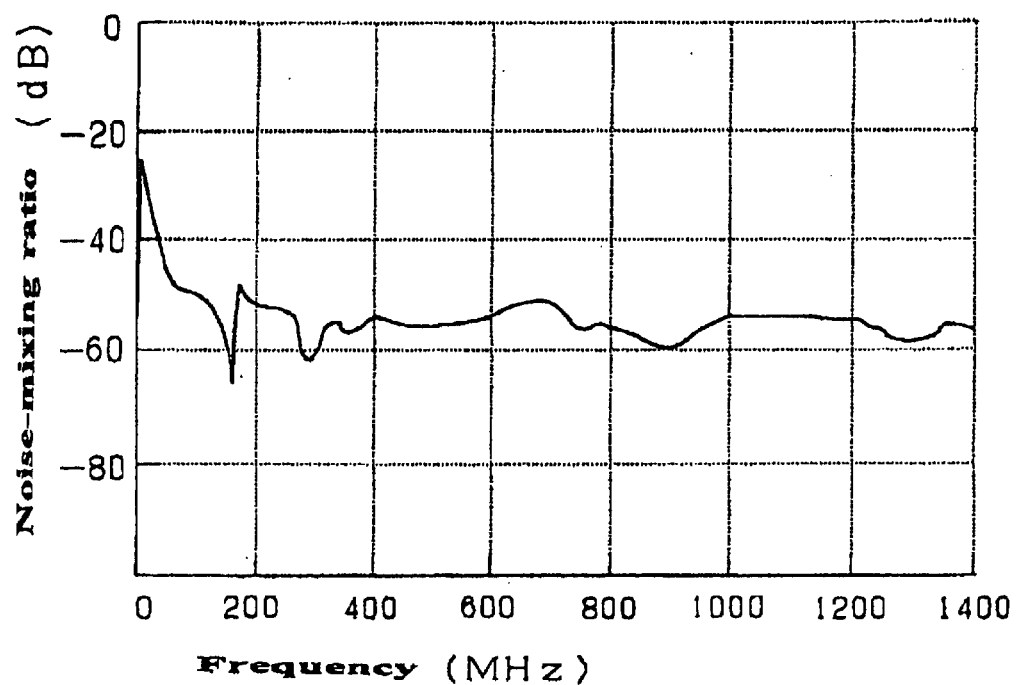
FIG. 10 is a characteristic view of a noise-mixing ratio of FIG. 8.

FIG. 7 illustrates other embodiments of the coupling transformers, wherein in (a), an up-stream coupling transformer and a down-stream coupling transformer are not completely symmetrical circuits, and a center of either winding (of the second windings) of only the up-stream one is grounded. The circuits need not be completely symmetrical as long as transmission characteristics in view of noise between terminals A–B and a–b or between terminals C–B and terminals c–b are equivalent to thereby obtain equivalent characteristics as those of the circuit of FIG. 5. In FIG. (b), winding numbers of primary and secondary windings of the coupling transformers are set to be different with a turns ratio being 1:n (n=1,2 . . . ), wherein neither of them are grounded at their centers. In this manner, it is also possible to set the winding numbers of the primary and secondary windings to be different, to achieve impedance match by connecting these in a conversed manner, and to thereby obtain favorable characteristics.

Moreover, it is not necessary to set identical frequency characteristics for the up-stream coupling transformer and the down-stream coupling transformer, and as long as A–B and C–D are of identical characteristics, the frequency characteristics of a secondary side (B–D) current and a primary side (A–C) current by which the secondary side current is induced need not to be identical. For instance, it is possible to use one of low-frequency type for the up-stream coupling transformer and one of high-frequency type for the down-stream coupling transformer. In this manner, it is possible to form a protector exhibiting characteristics of both with favorable passing characteristics over a broad range of frequencies. However, for frequency bands in which streamed noise will be problematic, it will be desirably to set the characteristics to be identical.

It should be noted that while the choke coil as illustrated in FIG. 3 is not provided in the above-described embodiment of the protector, it is possible to improve pressure resistance by providing a similar choke coil.

As it has been explained in details, with the device for preventing mixing of extrinsic noise according to the invention of Claim 1, it is possible to obtain favorable noise-mixing ration characteristics up to frequencies exceeding 1000 MHz, and it is possible to eliminate extrinsic noise flowing into up-stream signals with a simple arrangement of connecting coupling transformers in a respectively converted manner.

According to the invention of Claim 2, it is possible to improve dielectric strength by providing a choke coil in addition to the effects of Claim 1.

According to the invention of Claim 3, it is possible to realize a simple arrangement in addition to the effects of Claims 1.

According to the invention of Claim 4, it is possible to exhibit favorable passing characteristics over a broad range of frequencies in addition to the effects of Claim 1.

According to the protector according to the invention of Claim 5, high-frequency signals that have entered the input terminal will transmitted to the output terminal with hardly any losses. Noise-mixing ratio characteristics of such a circuit are identical to those of the above FIG. 2, and it is possible to eliminate streamed noise streaming into up-stream signals.

What is claimed is:

1. A device for preventing mixing of extrinsic noise comprising an input terminal and an output terminal to which coaxial cables are connectable, with high-frequency signals being passed between the input terminal and the output terminal while direct current is prevented from passing on both, a core wire side and a ground side, wherein a pair of coupling transformers with primary windings and second windings is provided between the input terminal and the output terminal through cascade connection with one end of a primary winding on an up-stream side of the pair of coupling transformers being connected to a core wire of the input terminal while the other end thereof is connected to a ground on the input side, and wherein one end of a secondary winding on a down-stream side is connected to a core wire of the output terminal while the other end thereof is connected to a ground on the output side of which direct current is prevented from passing.

2. The device for preventing mixing of extrinsic noise as claimed in claim 1, wherein the one end connected to the core wire of the input terminal of the up-stream coupling transformer and the one end connected to the core wire of the output terminal of the down-stream coupling transformer are connected through a choke coil.

3. The device for preventing mixing of extrinsic noise as claimed in claim 2, wherein the pair of coupling transformers are connected such that turns ratios of the primary windings and the second windings are opposite to each other.

4. The device for preventing mixing of extrinsic noise as claimed in claim 2, wherein frequency characteristics of the pair of coupling transformers are set such that one is of low-frequency passing type and the other of high-frequency passing type.

5. A protector comprising the device for preventing mixing of extrinsic noise as claimed in claim 2, the protector comprising an arrestor and a choke coil for preventing breaking in of abnormal voltage.

6. The device for preventing mixing of extrinsic noise as claimed in claim 1, wherein the pair of coupling transformers are connected such that turns ratios of the primary windings and the second windings are opposite to each other.

7. A protector comprising the device for preventing mixing of extrinsic noise as claimed in claim 6, the protector comprising an arrestor and a choke coil for preventing breaking in of abnormal voltage.

8. The device for preventing mixing of extrinsic noise as claimed in claim 6, wherein frequency characteristics of the pair of coupling transformers are set such that one is of low-frequency passing type and the other of high-frequency passing type.

9. A protector comprising the device for preventing mixing of extrinsic noise as claimed in claim 1, the protector comprising an arrestor and a choke coil for preventing breaking in of abnormal voltage.

10. The device for preventing mixing of extrinsic noise as claimed in claim 1, wherein frequency characteristics of the pair of coupling transformers are set such that one is of low-frequency passing type and the other of high-frequency passing type.

11. A protector comprising the device for preventing mixing of extrinsic noise as claimed in claim 10, the protector comprising an arrestor and a choke coil for preventing breaking in of abnormal voltage.

* * * * *